US006842768B1

(12) United States Patent
Shaffer et al.

(10) Patent No.: US 6,842,768 B1
(45) Date of Patent: Jan. 11, 2005

(54) APPARATUS AND METHOD FOR SELECTABLE COMPRESSION

(75) Inventors: Shmuel Shaffer, Palo Alto, CA (US); William J. Beyda, Cupertino, CA (US)

(73) Assignee: Siemens Communications, Inc., Boca Raon, FL (US)

( * ) Notice: Subject to any disclaimer, the term of this patent is extended or adjusted under 35 U.S.C. 154(b) by 0 days.

(21) Appl. No.: 09/516,908

(22) Filed: Mar. 1, 2000

(51) Int. Cl.[7] .............................................. G06F 15/16
(52) U.S. Cl. ....................... 709/203; 709/217; 709/231
(58) Field of Search ................................. 709/203, 217, 709/219, 224, 231, 246, 218

(56) References Cited

U.S. PATENT DOCUMENTS

| | | | |
|---|---|---|---|
| 5,283,887 A | 2/1994 | Zachery ...................... 395/500 |
| 5,359,593 A | 10/1994 | Derby et al. .................. 370/17 |
| 5,522,041 A | 5/1996 | Murakami et al. ..... 395/200.01 |
| 5,557,749 A | 9/1996 | Norris .................... 395/200.18 |
| 5,574,724 A | 11/1996 | Bales et al. ................ 370/68.1 |
| 5,592,220 A | 1/1997 | Ishii et al. ................... 348/220 |
| 5,621,660 A | 4/1997 | Chaddha et al. ........ 364/514 R |
| 5,627,997 A | 5/1997 | Pearson et al. ............. 395/500 |
| 5,675,789 A | * 10/1997 | Ishii et al. ................... 707/204 |
| 5,908,467 A | * 6/1999 | Barrett et al. ............... 709/218 |
| 6,014,694 A | 1/2000 | Aharoni et al. ............. 709/219 |
| 6,078,961 A | * 6/2000 | Mourad et al. ............. 709/235 |
| 6,091,777 A | * 7/2000 | Guetz et al. ............ 375/240.11 |
| 6,105,029 A | * 8/2000 | Maddalozzo et al. ......... 707/10 |
| 6,151,632 A | * 11/2000 | Chaddha et al. ............ 709/231 |
| 6,243,761 B1 | * 6/2001 | Mogul et al. ................ 709/246 |
| 6,253,246 B1 | * 6/2001 | Nakatsuyama ............... 709/233 |
| 6,397,230 B1 | * 5/2002 | Carmel et al. ........... 707/500.1 |
| 6,397,251 B1 | * 5/2002 | Graf ........................... 709/225 |

FOREIGN PATENT DOCUMENTS

| | | | |
|---|---|---|---|
| JP | 6-125363 | 5/1994 | ........... H04L/11/20 |
| WO | WO 99/00984 | 1/1999 | ............ H04N/7/24 |

OTHER PUBLICATIONS

Fereira, "Chapter 31 VDOlive Technology" at symphony.score.is.tsukuba.ac.jp/~liq/Book/Web/ch31.htm.
Bentley et al., "The freedom to choose: Transforming content on–demand in the BSCW Shared Workspace system" at bscw.gmd.de/Papers/WebNet97/Transform.html.
*Mailessentials for Exchange/SMTP* at http://www.gficomms.com/me/mesfeatures.htm.
*MaX Commpression* at /www.c2c.com/products/maxcomp.htm.
*The Technology of Inverse Multiplexing* apac.ascend.com/1130.html, prior to Jun. 23, 1999.
Anonymous: "Method to Deliver Scalable Video across a Distributed Computer System" *IBM Technical Disclosure Bulletin*, vol. 37, No. 5, May 1994, pp. 251–256.
Campbell et al., "Meeting End–To–End QoS Challenges for Scalable Flows in Heterogeneous Multimedia Environments," *High Performance Networking VI, IFIP 6th International Conference on High Performance Networking (HPN)*, Palma De Mallorca, Sep. 13–15, 1995 No. CONF 6, Sep. 11, 1995, pp. 101–115.
Carlson, "Bandwidth Management," *PPP Design and Debugging*, Chap. 6.
www.realnetworks.com.
wysiwyg://30/service.real.com/help/library/blueprints.html.
service.real.com/help/library/whitepapers/wpaper.html.
International Search Report—Int'l Appln. No. PCT/IL98/00300; search completed Oct. 07, 1998.

* cited by examiner

*Primary Examiner*—Viet D. Vu
*Assistant Examiner*—Jinsong Hu

(57) ABSTRACT

Messages or data files of various compressions can be intelligently and efficiently managed as needed based on a current connection speed. According to a specific embodiment of the invention, channel speed is determined, and for lower speed channels messages or data files with higher compression may be transmitted.

26 Claims, 3 Drawing Sheets

| WHO | DATE | SUBJECT | TRANSFER TIME | | |
|---|---|---|---|---|---|
| | | *(Compression Autoselect)* | No Compression 410 | Medium Compression 412 | High Compression 412 |
| ☏ Outside Phone Call | 12/26/99 | "Wave File" | 3m10sec | 47sec | 24sec |
| ☏ Ext. 613 (Robin Jay) | 12/26/99 | Transcribed Text | <1sec | x | x |
|     Attachment | 12/26/99 | *Audio Attachment* | 2m12sec | 20sec | 11sec |
| ✉ Cheryl Crow | 12/26/99 | When are you back? ... | <1sec | x | x |
| ✉ System Administrator | 12/26/99 | Maintenance | 10sec | 1sec | x |
| ✉ Allen Eagle | 12/26/99 | Attached is our Annual Report in PDF | <1sec | x | x |
|     Attachment | 12/26/99 | *Annual.pdf Attachment* | 2m30sec | x | 45sec |
| ☏ Ext. 381 (Joe Hawk) | 12/26/99 | Transcribed Text | <1sec | x | x |
|     Attachment | 12/26/99 | *Audio Attachment* | 1m15sec | 18sec | 10sec |
| ✉ GET RICH QUICK!! | 12/26/99 | U DON'T WANT TO MISS THIS!!!! | 1sec | x | x |
| ☏ Outside Phone Call From 510-987-1234 | 12/26/99 | "Wave File" | 8m45sec | 2m10sec | 1m10sec |

FIG. 6

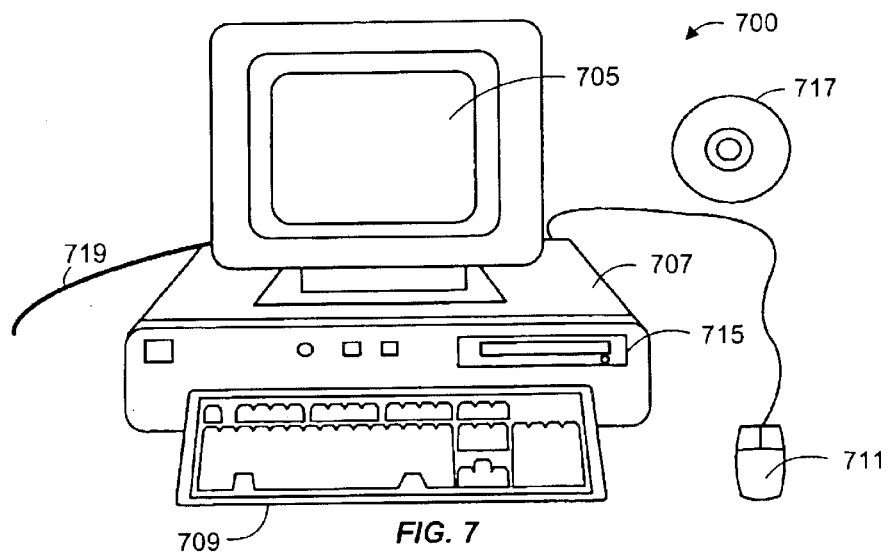

FIG. 7

APPARATUS AND METHOD FOR SELECTABLE COMPRESSION

BACKGROUND OF THE INVENTION

The present invention relates to communication of data. More particularly, the present invention relates to methods and apparatus useful in logic devices for adjusting a message, attachment, or data file size prior to transmitting. In a specific embodiment, the invention provides a unique user interface.

Multimedia messaging systems that can integrate and deliver voice, email, fax, and/or other data are increasingly of interest in environments with installed local area networks (LANs) that have sufficient bandwidth. One such known system is the Xpressions™ unified messaging system, available from Siemens Information and Communication Networks, Inc. Common multimedia messaging applications are message delivery software applications that can deliver one or more of a variety of messages, such as voice mail messages, which are generally stored as WAV, RealAudio, or other digitally-encoded audio files. Some multimedia messaging applications can-also deliver other types of digitally encoded files, such as video, still images, facsimiles, or executable files.

Some types of multimedia messages can result in much larger files for transmission than typical text messages. Due to the relatively large amount of digital data generally used to represent voice, for example, a voice mail message of just a minute can result in a large file.

When accessing such a large file for playback over an institutional LAN with substantial available bandwidth, minimal delay is incurred. Typical LANs available today have maximum design bandwidths of 10 Mbps to 100 Mbps, with future designs planned of 1 Gbps. In contrast, remote connection to an institutional server, either from a home or while travelling, is often accomplished over a public telephone network using a modem (sometimes referred to as POTS, for plain old telephone service). A typical fast modem speed or bandwidth is 56 Kbps, substantially slower than the speed or bandwidth of a typical institutional LAN. Other remote connection methods, such as wireless, ISDN, or DSL, also can be substantially slower than LAN speeds. As a result, when a user attempts to access multimedia emails from home or while travelling, a voice mail message of one minute can take several minutes to download. Commonly-owned patent application Ser. No. 09/516,689 entitled Apparatus and Method for Adjustable Data Rate in Multimedia Messaging Systems, filed concurrently herewith, discusses prior art and novel methods for addressing the above problem using a second connection or channel (such as a second phone line or ISDN channel). While a second channel may be available at some locations, such as a home or satellite office, a second channel will often not be available at other locations, such as at a hotel room or an infrequently used home office.

Variable compression techniques are known for some audio and video transmission technologies. These techniques have generally been applied to continuous-stream type of communications, such as a phone call or video transmission. Under these techniques, available channel capacity is detected and compression of video or audio is adjusted to fit available bandwidth. As known in the art, increased compression is generally associated with reduced fidelity in the compressed signal. Such systems are not effective for file systems or multimedia message systems, where different compression amounts and formats may be appropriate or desired for different file formats or file lengths. One example of a variable compression technique for delivering video over a network is discussed in U.S. Pat. No. 6,014,694 issued to Aharoni et al. In conmnon with some other prior art techniques, this method relies on a specific encoding format that can add and drop levels of data based on congestion in the channel. The Aharoni et al. patent also discusses measuring channel bandwidth dynamically during transmission and adjusting transmission until the sending bandwidth is equal to the receiving bandwidth.

What is needed is a method or an apparatus that can provide an acceptable means for accessing large data files, such as multimedia messages or other compressible data, over a reduced bandwidth channel.

SUMMARY OF THE INVENTION

The present invention may be understood in the context of a remote user accessing a data retrieval application. An important application for the present invention, and an independent embodiment, is a multimedia messaging application. Multimedia message applications combine access to communications services such as e-mail, voice mail, and facsimile in a unified interface. In some cases, these systems can interact with other important applications, for example known Enterprise Resource Planning applications.

However, using the teachings provided herein, it will be understood by those of skill in the art, that the methods and apparatus of the present invention could be advantageously used in other situations that allow a user to download separable data items or data files, such as file server systems, systems for downloading compressible video files, systems for downloading compressible audio files, etc. Therefore, as used in the description of the invention below, accessing or downloading a message or message attachment should be understood to include accessing or downloadable other types of data, unless the context requires otherwise.

In various embodiments of the present invention, a channel speed is known or determined and a transmit delay for a particular data file at an original size and one or more compression formats is calculated. The channel speed, along with the size of the data transfer, is used to select an appropriate compression ratio for a message, message attachment, or other compressible file. In specific embodiments, a user may indicate (either at the time of transfer, the time of login, or during client setup) an acceptable delay or desired compression for a transfer.

The invention will be better understood with reference to the following drawings and detailed descriptions. In different figures, similarly numbered items are intended to represent similar functions within the scope of the teachings provided herein. In some of the drawings and detailed descriptions below, the present invention is described in terms of the important independent embodiment of a multimedia message system. This should not be taken to limit the invention, which, using the teachings provided herein, can be applied to other data accessing situations.

BRIEF DESCRIPTION OF THE DRAWINGS

FIG. 6 is a diagram illustrating a portion of an example user interface according to specific embodiments of the invention.

FIG. 7 is a diagram illustrating an example computer device that can embody aspects of the present invention.

DESCRIPTION OF SPECIFIC EMBODIMENTS

Figure 1:
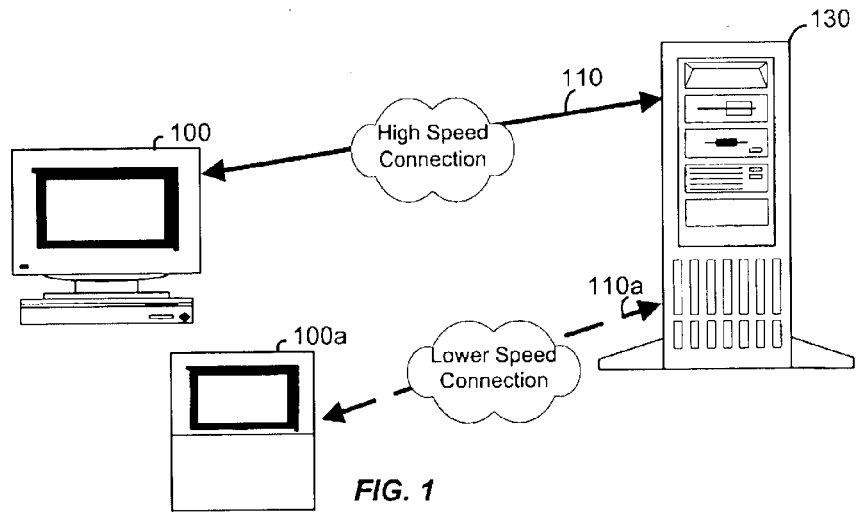
FIG. 1 is a simple block diagram showing first and second user digital devices connectable to a data server over one of two possible channels or connection speeds.

To aid understanding by the reader, the invention will be explained in the context of specific computer system configurations. FIG. 1 is a simple block diagram showing first and second user digital devices connectable to a data server over one of two possible channels or connection speeds. Digital devices 100 and 100a can each be any type of information appliance, such as, but not limited to, a PC, a laptop computer, a personal digital assistant (PDA), cellular phone, a television with data access capabilities, etc. Device 130 represents any type of device or system or network that provides data to user information appliances, such as, but not limited to, a file server, an email server, a multimedia message server, a video server, a voicemail server, etc. As will be understood from the art and the teachings provided herein, while device 130 is represented in FIG. 1 as a single computer, this is but one example for implementing a data service. Data services may be implemented in a variety of ways, such as but not limited to groups of cooperating computers, a logical process or component of a larger computer, networked computers, etc.

Two example data channels are shown for purposes of discussion, a high speed connection 110 and a lower speed connection 110a. Each of these connections can be any kind of data communication channel, such as, but not limited to, a dial-up line over a modem, an ISDN connection, a DSL connection, a wireless connection, a cable modem connection, etc.

FIG. 1 can be understood to illustrate as an arrangement for downloading various data files from a system or network 130 where they reside to a user's digital device 100 or 100a. As will be understood, the situation can arise where the connection speed or connection channel (110 or 110a) through which a user will receive a data file will vary from time to time. One type of variation can result when a user uses two different channels at two different times, for example, a LAN connection at an institutional site and a dial-up connection from home. Another type of variation can result from available speeds in the same channel at different times. Thus, 110 and 110a might represent the same connection that experiences different available channel bandwidths at different times, such as networks subject to varying congestion. As will be further understood, this variation can occur when a user is using two physically different logic appliances to access data (such as a computer system at home and a different on in an office) or when a user uses the same appliance, either over different connections (such as a portable computer that is carried from home to office or while travelling) or over the same connection experience different speeds at different times.

As described above, a problem may arise for a user accessing a data server when invoking transfer of large data files. In an institutional environment, transfer of large data files may not be a problem because many institutions have high-speed networks with sufficient available bandwidth. When the same user is accessing, for example, large data files away from the office, a generally much lower speed connection (e.g. 56 Kbps) may be used. Therefore, large files can cause unacceptably long delays.

Figure 2:
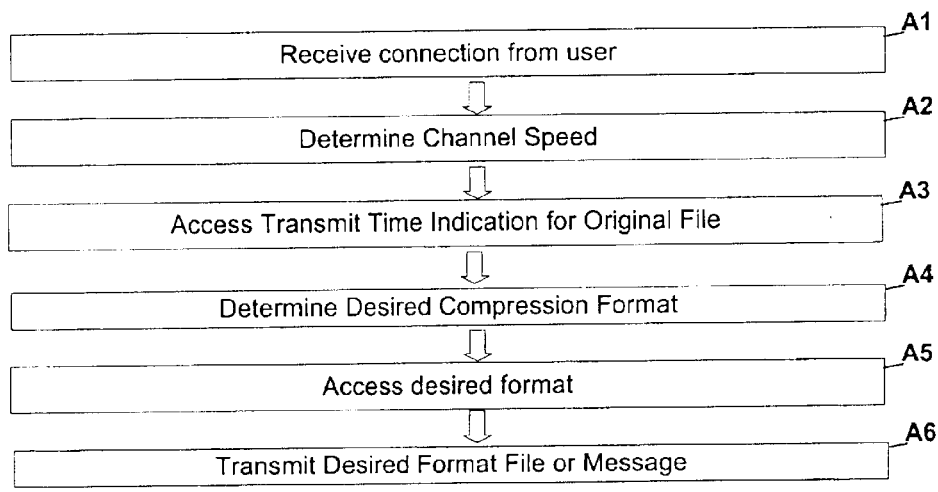
FIG. 2 is a flowchart illustrating a general method for allowing selectable transmission of compressed files according to an embodiment of the invention.

FIG. 2 is a flowchart illustrating a general method for allowing selectable transmission of compressed files according to an embodiment of the invention. This general method is provided to address the problems just discussed in accessing large data files over varying speed connections.

The method may be understood as beginning upon a connection from a user (Step A1). This connection may be initiated according to any connection method or login procedure known in the art. The transit speed for the channel is determined (Step A2). As discussed elsewhere, this determination may be made in a number of ways, such as by simply reading characteristics of an incoming connection or sending and timing a test message over the connection. In some embodiments, based on an initially determined channel speed, a decision is made whether or not compressed data will be provided as a transmission option. For higher speed channels, in some embodiments, no compressed data will be prepared or transmitted, and the method will default to normal access.

If compressed files are to be used, a transmit time indication for an original file is accessed (Step A3). This transmit time may be determined by multiplying the transit speed for the channel and the size of the files. This transmit time indication may be computed just for an original file or for original files and compressed versions of those files, either from an actual compressed file size or from an estimated compressed file size in instances where files are not compressed until a compressed transmission is requested. This indication may be a number indicating an estimated delay time or the indication may be a more general indication, such as fast, medium and slow, or simply, greater-than-threshold or less-than-threshold.

In conjunction with or after the previous step, a transmit format is determined (Step A4). This may be determined without user intervention, by reference to a stored threshold value. For example, a system parameter may indicate that compressible files that would take greater than a particular time interval to download should be transmitted in compressed form. This parameter may be adjustable by a user. In alternative embodiments, however, a transmit format may be determined by transmitting indications for display to a user and waiting to receive a user selection for a file.

Once the transmit method user preference is determined, a compressed file is accessed if so indicated (Step A5). In some situations, this compressed file will have already been prepared and be available as soon as the transmit method is determined. In other embodiments, a compressed file will be prepared only upon determination that a compressed file is required. Once the appropriate file is available, it is transmitted to the user (Step A6).

In instances where the previous method is used in a server that will provide multiple files to a user, the steps of the method may all take place for multiple files as soon as a user connects to a system. For example, if a user on a multimedia message system elects to have all current, unread, messages downloaded upon connection, the method can be performed on multiple messages which will all be downloaded without waiting for further user input. In an alternate use, the method could be performed on individual files, messages, or attachments when selected by a user for download.

It will be understood to practitioners in the art and from the teaching provided herein that the steps of this method as herein described may be performed exclusively by a server-side system, such as system 130. Alternatively, the method may be performed by a server-side system operating in cooperation with a user-side system.

It will be further understood to practitioners in the art and from the teaching provided herein that the steps of this method, in various embodiments, may be performed in different orders. For example, alternative compressed messages may be prepared in advance for some or all users, before a determination is made regarding transmit time.

While user logic devices 100 and 100a are illustrated as having a visible display, it should be understood that presentation of information and receiving of commands may be accomplished via audio input and/or output, such as a computer system customized for use by a visually impaired person or a telephone interface capable of presenting and/or accepting audio data.

Figure 3:
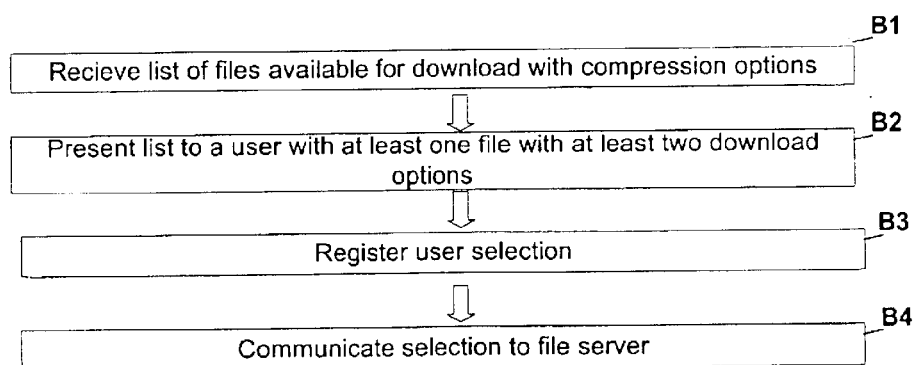
FIG. 3 is a flowchart illustrating a method for presenting various compression options to a user.

FIG. 3 is a flowchart illustrating a method for presenting various compression options to a user. It will be understood to practitioners in the art and from the teachings herein that the steps of this method may be performed exclusively by a client-side system, or, alternatively, by client-side system in cooperation with server-side devices. As described above, the present invention can be alternatively embodied in a system that transmits compressed files without direct user intervention or selection, in which case this method will not be performed.

The method may be understood as beginning upon a reception of a list of files available for download with compression file options (Step B1). Logic at the client-side displays the list and compressed file option data to a user. When large data files are present, display to a user may involve at least one file name or identification message !T! with at least two selectable options indicating two different levels of compression or indicating two different download times (Step B2). Optionally, there may also be a selectable option that a user can use to indicate that the system should download a compressed file or original file according to default rules. Selection by a user is registered by the client-side logic (Step B3) and is communicated so that the appropriate file format may be transmitted (Step B4).

As will be apparent from the teachings herein and the known art, the method as described above may include an option that, while accessing a file (or message), allows a user to request presentation of a next file without necessarily referring back to the list. This request may include an indication to delete a current file or message.

A number of options are possible for incorporating a next indication into various embodiments of the invention, as will be apparent from the teachings herein. In one embodiment, a request for a next file or message can always go immediately to the next file and download the next file according to default setup parameters. In a further embodiment, a request for a next file or message will display specific file download options for that file if that file exceeds a threshold size. In a further embodiment, a request for a next file or message will return the user to the displayed list if that file exceeds a threshold size. Specific embodiments Can include several of these options and allow a user to configure which options are activated.

The present invention has thus far been described in terms of general methods and devices. The previous description is believed to be a full and complete description sufficient to allow an ordinary practitioner in the art to make and use the invention. It will be understood to those of skill in the art from the teachings provided herein that the described invention can be implemented in a wide variety of specific programming environments and logical systems (such as UNIX, Windows, Solaris, Oracle, etc.) using a wide variety of programming languages (such as SQL, Visual Basic, Pascal, C++, Basic, Java, etc.) and wide variety of file formats.

What follows are descriptions of example systems and methods that embody various aspects of the present invention. It is intended, however, that the previous discussion and the claims not be limited by examples provided herein. It is further intended that the attached claims be read broadly in light of the teachings provided herein. Where specific examples are described in detail, no inference should be drawn to exclude other known examples or examples described briefly from the broad description of the invention or the language of the claims. It is therefore intended that the invention not be limited except as provided in the attached claims and equivalents thereof.

Multimedia Message Systems

Figure 4:
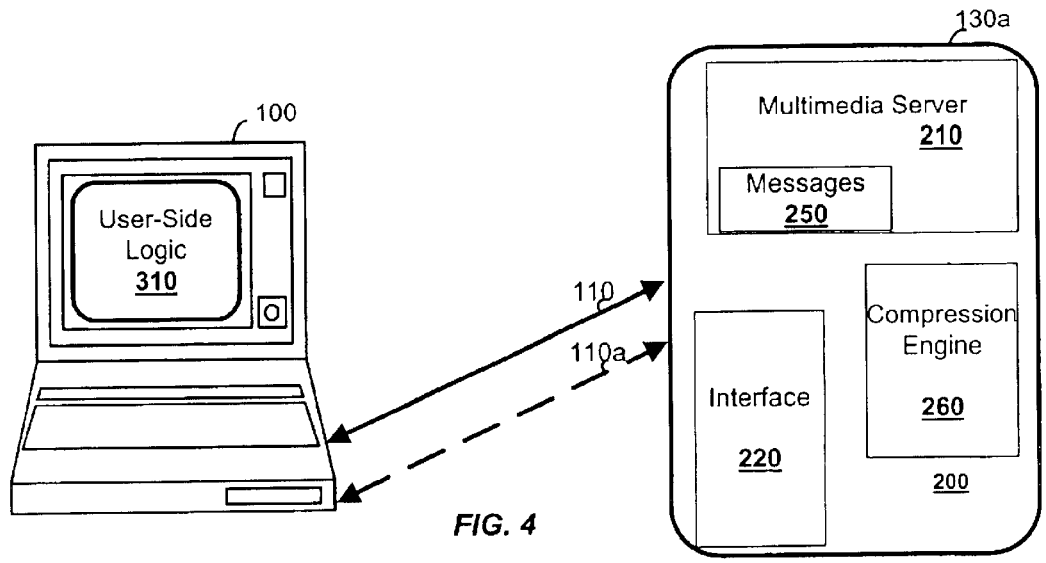
FIG. 4 is a simple block diagram showing, according to a specific embodiment of the invention, a multimedia message system being accessed by user-side logic over one of two possible channels or connection speeds.

FIG. 4 is a simple block diagram showing, according to a specific embodiment of the invention, a multimedia message system being accessed by user-side logic over one of two possible channels or connection speeds. FIG. 4 shows a particularly important specific embodiment of the present invention and will be explained by way of a specific example. It will be apparent to those of skill in the art from the teachings herein that many variations in the details of operation of this example lie within the scope of the invention.

In this embodiment, an message server 210 runs primarily in a server process space 130a and is accessed by a user logic 310 running on a user information appliance 100. The user logic and server process space communicate over a high-speed connection 110 or an alternate lower-speed connection 110a.

According to this embodiment, a user logs into server 210 from 310, as is known in the art. Server 210 sends to 310 data that allows 310 to display to the user a list of available files or messages in accordance with any preset user or system parameters. As is known in the art, system 310 allows the user to make a selection from messages (or other data files) 250 for presentation. As is known in the art for multimedia message systems, some messages can themselves be digitally encoded audio data or video data. Messages can also have attachments that are either of these or other large data files. An interface module 220 handles communications between the client and server. A compression engine 260 handles compression for files or messages where indicated.

Figure 5:
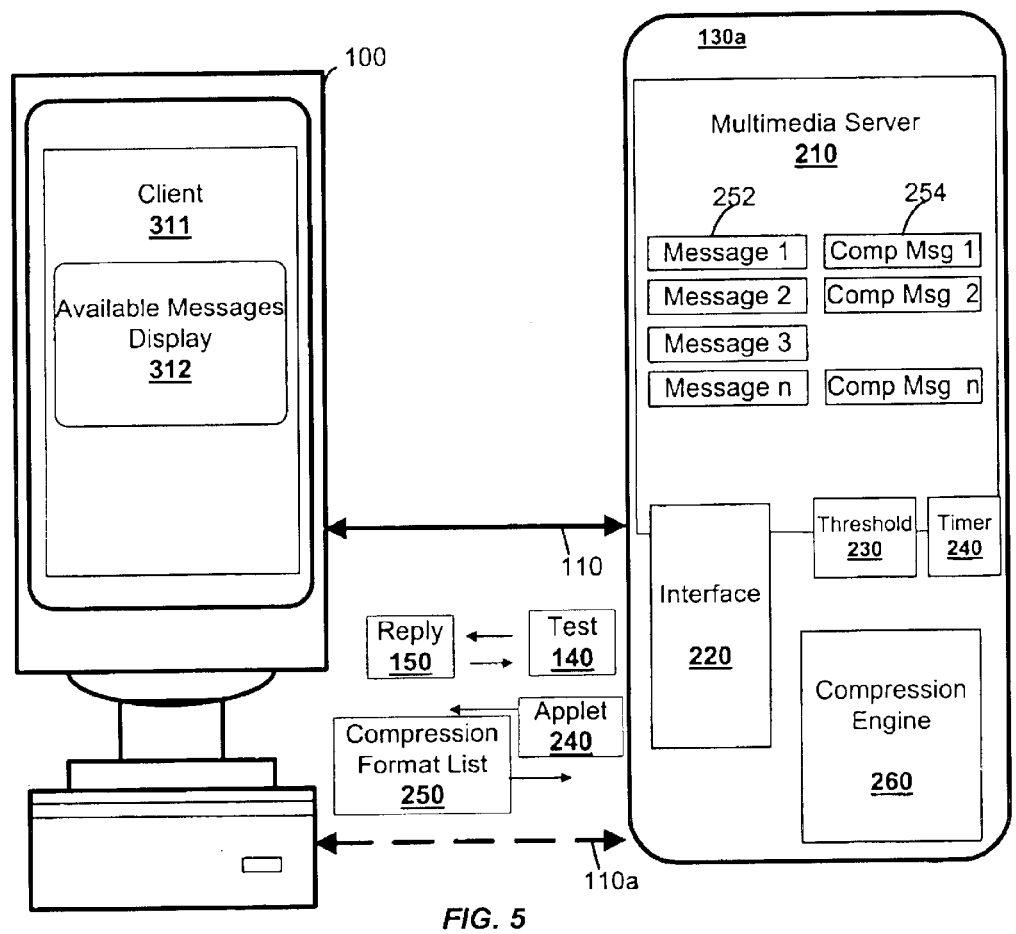
FIG. 5 is a block diagram of a specific exemplary system embodying aspects of the invention and showing details of specific embodiments of the invention.

FIG. 5 is a block diagram of a specific exemplary system embodying aspects of the invention and showing details of specific embodiments of the invention. This exemplary embodiment includes specific mechanisms for determining a channel speed and file transfer time and for handling compression that will not be present in all embodiments. FIG. 5 shows a representation of a test 140 and reply 150 communicated between a user appliance and a server. This figure also shows a list of compression formats 250 reported by a client and an applet 240 downloaded from a server to allow a client to handle an additional compression format. Interface 220, threshold value 230, and timer 240 are shown and operate as described above. The figure shows a representation of multimedia email system 210 with individual original messages 252 and !compressed messages 254.

Various techniques for determining a channel speed may be used according to the invention. The above referenced incorporated, commonly-owned patent application discusses alternative systems and methods for determining a channel speed. A channel speed may be directly known by a client or server based on how the user initially accessed the server or based on monitored user transmissions, and that value can be read by the present invention.

However, many connections will have an effective speed that can vary over time or that are not easily read from system parameters. This is especially true for dial-up connections, wireless connections, and very heavy-traffic network connections. In this case, a mechanism as indicated in FIG. 5 and as discussed in the above-referenced patent application, may used to determine channel speed using a test packet.

According to this embodiment of the invention, to determine channel speed a small test data unit (140) is sent between a multimedia messaging server (130) and a client (100) over the active channel (110 or 110a). This test message allows the invention to measure an average channel speed, which then may be used to estimate a total transmit time for a particular data file or message. The test message may be sent over the channel in either direction, and the transit time for the test message may be calculated by either the server or the client and then communicated to the other where necessary. Where 100 and 130 have a common clock between them, the transit time for the test message can be determined by sending a single time-stamped test message in one direction. Where there is no shared clock or where there is a desire to measure actual round-trip delay, a reply data unit (150) is sent and the transit time is calculated from the reply receive time. As is known in the art, the reply data unit 150 may carry information about the time delay between the receipt of 140 and the sending of reply 150 so that allowances can be made for processing delays.

With channel speed determined, transmit time for a particular file is calculated from the size of a file or message or attachment. This calculation may be made at either the client, or the server, or both. This calculation can be made in a straightforward manner, by multiplying the per-byte transmit speed by the number of bytes in a message. The calculation may also take into account any overhead latencies or other transmit characteristics as known in the art.

According to the invention, when indicated by the connection or channel speed and the message or attachment size, a server makes a compressed version of the data file available for transmission. This compressed data file may be prepared by the server by a compression engine 260 before a user ever accesses an email account, or the file may be compressed on-the-fly as a user logs in or as a user requests download of a particular message. Various options may be incorporated in a particular embodiment of the invention, or an embodiment of the invention may operate according to a number of different options, based on system or user parameters and operating conditions.

Compression may be controlled by a number of setup parameters. Some of these parameters may be established system wide, while others may be established for an individual user. As an example, a user may set a parameter to indicate that the user never or rarely accesses e-mail outside the office. For that user, the email system may not prepare any compressed messages until the user first logs on from a slow connection. A different user may travel only rarely, but for extended periods. This user may set a parameter to compress all messages exceeding the threshold while travelling and reset the parameter to compress no messages when the user returns to the office. A third user may daily access email from both home and work. This user may set up a parameter asking the system to always prepare compressed files for messages or attachments that will have more than a threshold transmit time at the slowest encountered setting. Other parameters according to the invention may indicate what decoding formats can be handled by the client and therefore allow a server to determine desired compression formats.

A system according to a specific embodiment of the invention can use artificial intelligence type analysis in media server 210 or a cooperating software component to determine when or how to compress messages based for example on different user's usage patterns and based on available system resources. In such a system, for example, compression may be performed only for users that have a history of logging in from lower-speed lines. The system may query a user the first time the user accesses email over a low-speed connection as to whether the user will likely do so again, with a series of options or questions. An example of one such option, which might be appropriately selected by a user while travelling, would be: "Please prepare compressed files for me until the next time I log in from a high-speed connection." An example of a different option, which might be appropriately selected by a user logging in very infrequently from a low-speed connection, would be: "Do not prepare compressed files for me until I log on from a low-speed connection."

An intelligent component of the system might also defer performing any pre-compression while the computer system is experiencing heavy use or might defer pre-compression or delete compressed files when available storage space is low.

According to specific embodiments of the present invention, a server according to the invention can perform compression according to a variety of compression algorithms. The server maintains information about which algorithms are available at a particular client and may learn from the client from time to time which algorithms are available at the client or desired by the user such as via a compression format list 250. According to a further embodiment, a server can in some instances download to the client an application or applet 240 to enable the client to handle a particular type of compressed file.

It should be understood that a data file or a message may be encoded into a variety of compression formats. Some of these formats, such as JPEG, MPEG, ZIP, or RealAudio have built-in variable compression. The present invention may be used with various audio formats, such as wave audio, G.723, RealAudio, GSM. The present invention may be used with various image formats, such as JPEG, GIF, TIFF, BMP, XIF, or PDF. The present invention may be used with various video formats, such as MPEG, AVI, etc. The present invention may also be used with compressed file formats, such as ZIP or Stufflt.

The present invention may be embodied into a data access system with a number of different options for user interaction, compression selection, and data transfer.

In one embodiment, the invention may operate for the most part transparently to a user. A data server and user logic, according to this embodiment, will determine a transmission speed for a connection, as discussed above, and will transmit compressed files when appropriate. A user may notice some reduced audio or video fidelity when connecting over a lower speed connection, and may adjust some overall operating parameters, but otherwise will interact with user logic over a lower speed connection just as he does over a higher speed connection. From the user's perspective, the display may look like one of any known email clients or data access clients.

In an alternative embodiment, the present invention will display for a user options to download uncompressed or compressed data for files. FIG. 6 is a diagram illustrating a portion of an example user interface according to specific embodiments of the invention.

In the example, a user display (400), displays a list of available files or messages, with identification data for messages (402), such as, but not limited to, sender, date or subject. As shown in this example, for some messages, the invention lists a download time as an uncompressed file (410) or as a compressed file (412) in one or two alternative formats. For some types of files, either no compressed format or less than a full number of compressed formats may be available. In this example, each download time is underlined, indicating that it is a clickable link. A user, presented with the interface, can for any message click on a preferred compression size or transmit time. Thus a user, while accessing a multi-media message system, can select, for each message, an appropriate compression ratio. For some messages, depending on length and the source of the message, a user may determine that maximum compression is likely to give adequate performance. While for other messages, a user may choose less compression or no compression. For example, a user may have one co-worker who speaks slowly and deliberately, and a user may chose high compression for messages from that co-worker. Another co-worker may speak very rapidly, and for that co-worker, the user may select low compression or no compression. A user may also initially select high compression for a file, and if the fidelity is not adequate, the user may then download a less compressed version of the file.

Other arrangements of the user interface of FIG. 6 are possible. For example, actual times may not be displayed and buttons may simply indicate compressed or non-compressed downloads. The interface may also include an option that allows a user to select a default download for a particular message, such as selecting the subject line, which will indicate to the invention that the invention should pick an appropriate compression for that message based on preset parameters.

Note that the user interface shown in FIG. 6 shows a number of different file types with different options. Two types of audio file are indicated, a Wave file used to encode internal voice mails, and an "audio" format, used for external voice mails. In this example, no compression options are provided for files that will take a short time to download. A PDF file attachment is listed in the example. In this particular embodiment, only a high compression version is shown for this essentially text file, because a decompressed text or executable file must generally be an exact copy of the original file, so only the highest compression that can be losslessly decompressed is used. However, some "text" files may contain embedded graphical, audio, or video elements and in specific embodiments of the invention these may be variably compressed.

Embodiment in a Programmed Information Appliance

FIG. 7 is a diagram illustrating an example computer device that can embody aspects of the present invention. The invention can be implemented in hardware and/or software. In some embodiments of the invention, different aspects of the invention can be implemented in either client-side logic or a server-side logic. As will be understood in Ii the art, the invention or components thereof may be embodied in a fixed media (and/or transmissible) program component containing logic instructions and/or data that when loaded into an appropriately configured computing device cause that device to perform according to the invention.

FIG. 7 shows an information appliance (or digital device) 700 that may be understood as a logical apparatus that can read instructions from media 717 and/or network port 719. Apparatus 700 can thereafter use those instructions to direct server or client logic, as understood in the art, to embody aspects of the invention. One type of logical apparatus that may embody the invention is a computer system as illustrated in 700, containing CPU 707, optional input devices 709 and 711, disk drives 715 and optional monitor 705. Fixed media 717 may be used to program such a system and may represent a disk-type optical or magnetic media, magnetic tape, solid state memory, etc. The invention may be embodied in whole or in part as software recorded on this fixed media. Communication port 719 may also be used to initially receive instructions that are used to program such a system and may represent any type of communication connection.

The invention also may be embodied in whole or in part within the circuitry of an application specific integrated circuit (ASIC) or a programmable logic device (PLD). In such a case, the invention may be embodied in a computer understandable descriptor language which may be used to create an ASIC or PLD that operates as herein described.

The invention has now been described with reference to specific embodiments. Other embodiments will be apparent to those of skill in the art. In particular, a user digital information appliance has generally been illustrated as a personal computer. However, the digital computing device is meant to be any device for interacting with a remote data application, and could include such devices as a digitally enabled television, cell phone, personal digital assistant, etc.

Also, channels have been described primarily as traditional phone lines or network connections, with the appropriate corresponding hardware. However, channels are meant to be any channels capable of carrying data, including wireless channels, optical channels, and electrical channels.

Furthermore, while the invention has in some instances been described in terms of client/server application environments, this is not intended to limit the invention to only those logic environments described as client/server. As used herein, "client" is intended to be understood broadly to comprise any logic used to access data from a remote system and "server" is intended to be understood broadly to comprise any logic used to provide data to a remote system.

It is understood that the examples and embodiments described herein are for illustrative purposes only and that various modifications or changes in light thereof will be suggested by the teachings herein to persons skilled in the art and are to be included within the spirit and purview of this application and scope of the claims. All publications, patents, and patent applications cited herein are hereby incorporated by reference in their entirety for all purposes.

What is claimed is:

1. A method for providing data files to a remote user over a channel comprising:

determining a speed of a channel, said determining including sending a test on said channel and detecting a transfer time of said test on said channel;

using said speed, estimating a transfer time for a data file;

responsive to said transfer time for said data file, and based on an adjustable threshold defined by the-remote user, determining whether to transfer either said data file or a compressed version of said data file, said adjustable threshold referring to a maximum delay for receipt of said data file;

receiving an indication from a user system as to what compression formats are decodable by said user system; and transferring said data file or a compressed version of said data file, based on said transfer time for said data file and whether said transfer time for said data file is within said adjustable threshold defined by the remote user, said compressed version of said data file being in conformity with compression formats decodable by said user system.

2. A method according to claim 1 wherein said determining the speed of a channel is initiated when a request is received from a user to download a large digital file.

3. A method according to claim 1 wherein said data files include at least one file of at least one file type from the group consisting of:

digitally encoded audio files,
digitally encoded video files,
digitally encoded text, and
digitally encoded images.

4. A method according to claim 3 wherein said data files include at least one file of each of at least two file types from the group.

5. A method according to claim 1 wherein said sending a test is initiated in response to a user login.

6. A method according to claim 1 further comprising:

transmitting-to a user-system an applet required to access a compressed file.

7. A method according to claim 1 further comprising:

transferring a compressed file instead of said large digital data file if said transfer time exceeds said adjustable threshold.

8. A method according to claim 7 further comprising:

if a time for transmitting a file exceeds said adjustable threshold, converting a file to another format in conformity with compression formats decodable by said user system.

9. A method according to claim 7 wherein said parameter includes said threshold.

10. A method according to claim 1 wherein said determining step is further based on usage level of a computer system.

11. A method according to claim 1 further comprising generating said compressed version of said data file.

12. A method according to claim 1, wherein said step of determining whether to transfer said data file or said compressed version is hereinafter referred to as the version determining step, the method further comprising determining whether to pre-generate said compression of said data file before said version determining step.

13. A method according to claim 12 wherein said step of determining whether to generate is based on a parameter specific to said remote user.

14. A method for providing remotely accessible multimedia messages comprising:

determining a speed of a channel, said determining including sending a test on said channel and detecting a transfers time of said test on said channel;

determining a transfer time for available messages and attachments using the size of available messages and attachments and said speed;

providing data representing a list of available messages to a user, wherein at least one listed message with a transit time greater than a user defined adjustable transit time threshold is provided with at least two compression options, said at least two compressible options being transferable within a user defined adjustable transit time threshold and being in conformity with compression formats decodable by a user system; and receiving from a user data indicating a desired compression option.

15. A method according to claim 14 wherein said multimedia messages include at least one file of at least one file type from the group consisting of:

digitally encoded voice messages,
digitally encoded email messages,
digitally encoded video messages, and
facsimiles.

16. A method according to claim 15 wherein said multimedia messages include at least one file of each of at least two file types from the group.

17. A method according to claim 14 further comprising:

transmitting to a user system an applet required to access a compressed file.

18. A method according to claim 14 further comprising:

using user access patterns and information and system information to determine whether to compress messages before a server is connected to by a user and to determine whether to delete precompressed messages when system resources are low.

19. A method according to claim 14 wherein said data representing a list of available messages includes an indication that, among the compression options, one indicated compression option provides a greater degree of compression than another compression option.

20. A method according to claim 19 wherein said at least two compression options include at least three compression options, and said data Includes an indication of the hierarchy of degree of compression among at least said three compression options.

21. A method according to claim 14 wherein said available messages include a message addressed to the user.

22. A method according to claim 21 where the message is of a message type from the group consisting of:

a telephony voice message,
a facsimile message, and
an electronic mail message.

23. A method according to claim 14 further comprising providing a message using only the desired compression option.

24. A server system able to communicate adjustable sized messages to a client comprising:

an interface (220) able to connect over a channel (110) or an optional channel (110a) to a user system;

a test (140) sent over an active channel to determine a channel speed;

a timer (240) able to determine said channel speed;

two or more message files (252) of a determined size, selectable for presentation; and one or more compressed message files (254), alternatively selectable for presentation, wherein at least one message file or compressed file is transferred to a client based on an adjustable threshold transit time defined by the client, said adjustable threshold transit time referring to a maximum delay for receipt of said data file at least one message file or compressed file.

25. An apparatus according to claim 24 further comprising:
analysis logic for determining whether to compress messages prior to access by a user, based on user parameters.

26. An apparatus according to claim 24 wherein said apparatus is embodied into a fixed media containing logic instructions that when loaded into appropriately configured computer systems will cause the system to embody said server.

* * * * *